United States Patent
Scheurich

(10) Patent No.: US 8,721,317 B2
(45) Date of Patent: May 13, 2014

(54) DEVICE FOR GRANULATING PLASTIC STRANDS

(75) Inventor: Jochen Scheurich, Niedernberg (DE)

(73) Assignee: Automatik Plastics Machinery GmbH, Niedernberg (DE)

( * ) Notice: Subject to any disclaimer, the term of this patent is extended or adjusted under 35 U.S.C. 154(b) by 592 days.

(21) Appl. No.: 12/670,596

(22) PCT Filed: Sep. 4, 2008

(86) PCT No.: PCT/EP2008/007228
§ 371 (c)(1),
(2), (4) Date: Apr. 7, 2010

(87) PCT Pub. No.: WO2009/036892
PCT Pub. Date: Mar. 26, 2009

(65) Prior Publication Data
US 2010/0276834 A1 Nov. 4, 2010

(30) Foreign Application Priority Data

Sep. 17, 2007 (DE) .......................... 10 2007 044 201

(51) Int. Cl.
*B29B 9/06* (2006.01)
(52) U.S. Cl.
USPC ........... 425/315; 425/301; 425/307; 425/311; 425/313; 425/316; 83/404.1; 83/444
(58) Field of Classification Search
CPC .................................... B29B 9/02; B29B 9/06
USPC ......... 425/292, 301, 307, 308, 310, 311, 313, 425/315, 316; 83/404.1, 421, 436.3, 436.4, 83/436.6, 444, 446
See application file for complete search history.

(56) References Cited

U.S. PATENT DOCUMENTS 2,739,647 A * 3/1956 Coste ........................... 83/356.3
3,845,681 A * 11/1974 Fritsch ......................... 83/356.3
(Continued)

FOREIGN PATENT DOCUMENTS

DE 2340682 A1 3/1975
DE 8600491 U1 6/1987
(Continued)

OTHER PUBLICATIONS

International Search Report in Application PCT/EP2008/007228 mailed Feb. 13, 2009.

(Continued)

*Primary Examiner* — Seyed Masoud Malekzadeh
(74) *Attorney, Agent, or Firm* — Pillsbury Winthrop Shaw Pittman LLP

(57) ABSTRACT

The invention relates to a device for granulating plastic strands having a cutting wheel (15), the individual blades of which graze past a counter blade (2) disposed in a blade carrier (1) when the cutting wheel is rotated, thus cutting the plastic strands (13) being guided over the counter blade into a granulate (14), wherein a rail (3a, 3b) composed of hard material running parallel to the counter blade is disposed adjacent to the counter blade and after said counter blade in the rotational direction of the cutting wheel that collects cut granulate and conducts said granulate into a discharge channel. The rail is held in a guide having an undercut (8, 9) in the blade carrier on both sides, wherein the undercut (9) facing the counter blade forms a separating strip (10), the thickness of which reduces outward in a blade-like fashion such that, along with the other undercut (8), the rail assumes an oblique position relative to the counter blade in the transverse direction, wherein the outer edge (11) of the undercut (9) facing the counter blade is in close proximity to the opposite front edge (12) of the counter blade and the other front edge of the rail protrudes in the direction of the cutting wheel.

10 Claims, 1 Drawing Sheet

(56) References Cited

U.S. PATENT DOCUMENTS

| | | | |
|---|---|---|---|
| 3,951,245 A * | 4/1976 | Hench et al. | 193/32 |
| 4,025,252 A * | 5/1977 | Hunke | 425/67 |
| 4,360,168 A * | 11/1982 | Peterson, Jr. | 241/294 |
| 4,530,649 A * | 7/1985 | Philipp et al. | 425/71 |
| 4,759,248 A * | 7/1988 | Muller et al. | 83/349 |
| 4,838,775 A * | 6/1989 | Hunke | 425/67 |
| 4,960,020 A * | 10/1990 | Reinhard | 83/34 |
| 5,146,822 A * | 9/1992 | Noda et al. | 83/22 |
| 5,186,959 A * | 2/1993 | Tanaka | 425/215 |
| 5,265,507 A * | 11/1993 | Noda et al. | 83/22 |
| 5,313,864 A * | 5/1994 | Forgash et al. | 83/349 |
| 5,545,025 A * | 8/1996 | Tanaka | 425/315 |
| 5,549,025 A * | 8/1996 | Muller | 83/694 |
| 5,634,601 A * | 6/1997 | Hild et al. | 241/224 |
| 5,658,601 A * | 8/1997 | Hoshi | 425/289 |
| 5,888,554 A * | 3/1999 | Zollitsch et al. | 425/71 |
| 6,039,905 A * | 3/2000 | Zollitsch et al. | 264/143 |
| 6,347,932 B1 * | 2/2002 | Kim | 425/71 |
| 6,575,069 B1 * | 6/2003 | Harwarth et al. | 83/583 |
| 6,779,429 B2 * | 8/2004 | Meidhof et al. | 83/674 |
| 2002/0100355 A1 * | 8/2002 | Meidhof et al. | 83/674 |
| 2004/0025658 A1 * | 2/2004 | Fisher et al. | 83/663 |

FOREIGN PATENT DOCUMENTS

| | | | |
|---|---|---|---|
| DE | 3611179 C1 | 11/1987 | |
| DE | 10103827 A1 | 8/2002 | |
| GB | 227174 | 1/1925 | |
| JP | 05050428 A * | 3/1993 | B29B 9/06 |
| WO | 1988006959 A | 9/1988 | |

OTHER PUBLICATIONS

International Preliminary Report on Patentability mailed Apr. 7, 2010 in related application No. PCT/EP2008/007228.

* cited by examiner

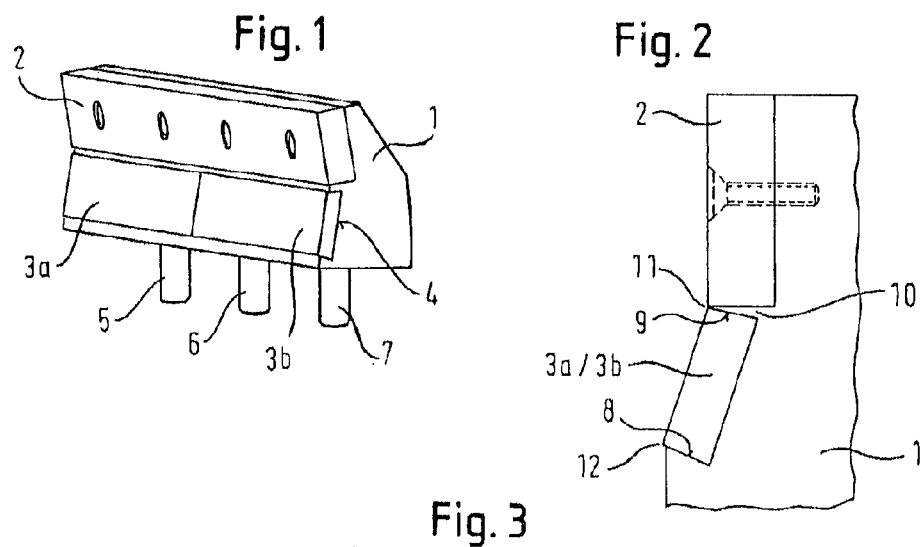
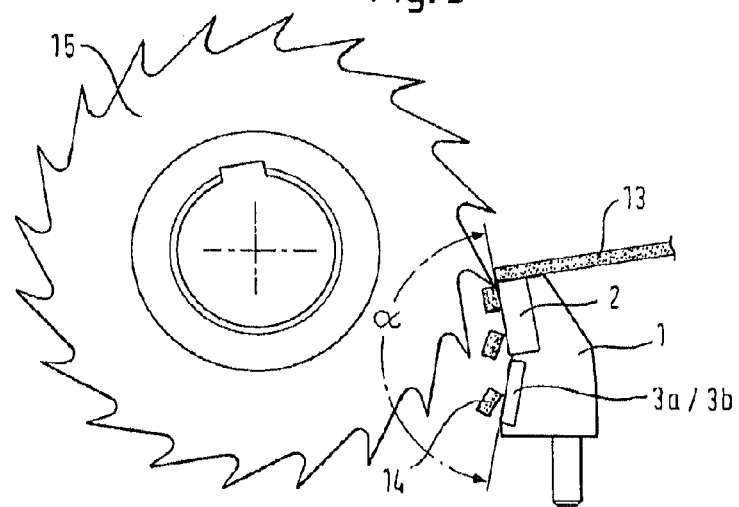
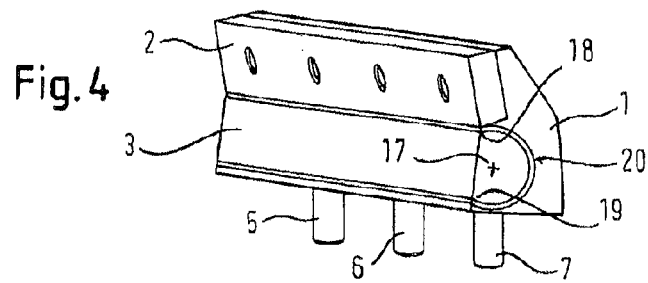

DEVICE FOR GRANULATING PLASTIC STRANDS

CROSS REFERENCE TO RELATED APPLICATIONS

This application is a U.S. National phase of International Application No. PCT/EP2008/007228, filed Sep. 4, 2008, which in turn claims priority to German Patent Application No. 10 2007 044 201.9, filed on Sep. 17, 2007. The contents of which are incorporated herein by reference in its entirety.

The invention relates to a device for granulating plastics strands having a cutting wheel, the individual blades of which graze past a counter blade disposed in a blade carrier when the cutting wheel is rotated, thus cutting the plastic strands being guided over the counter blade in to a granulate, wherein a rail composed of hard material running parallel to the counter blade is disposed adjacent to the counter blade and after the counter blade in the rotational direction of the cutting wheel that collects cut granulate and conducts the granulate into a discharge channel.

Such a device has already been used in practice, namely with the above-mentioned rail which avoids that granulate cut by the cutting wheel hits the cutting wheel below the counter blade with the speed of the teeth of the cutting wheel and that an undesired wear is caused thereat by the continuous friction with the granulate. This is avoided by means of the rail since it collects the granulate. A wear appearing directly at the rail, can be made ineffective thereby that the rail is exchanged in time from time to time which rail is screwed to the blade carrier in the known devices such that, after loosening the screw and removing the worn out rail, it can be replaced by a new rail. In connection with the use of the rail, the screws have proven to be disadvantages since they are subject to a special wear. The additional fact that the rail is fixed to the counter blade with distance such that a strip of the material of the blade carrier is exposed to the impact of the granulate and forms a special location of wear thereby. If the rail is advanced up to the counter blade, the engagement surface of the counter blade is made smaller and is weakened thereby.

The invention is based on the object to design and arrange the rail such that its exchange is facilitated and it is arranged such that the blade carrier is protected against wear. According to the invention, this is done thereby that the rail is held in a guide having an undercut on both sides, in the blade carrier wherein the undercut facing the counter blade forms a separating strip, the thickness of which reduces outwards in a blade like fashion such that, along with the other undercut, the rail assumes an oblique position relative to the counter blade in the transverse direction, wherein the outer edge of the undercut facing the counter blade is in a close proximity to the opposite front edge of the counter blade and the other front edge of the rail projects in the direction of the cutting wheel, By designing the guide of the rail with undercuts on both sides, for example in the shape of a dovetail guide, an easy exchangeability of the rail is obtained which is only to be shifted into the channel between the two undercuts. Therein, the rail may be arranged with its undercuts on both sides extending in its longitudinal direction such that the edge of the rail facing the counter blade practically reaches thereto such that no space for any special wear is existing anymore between the counter blade and the rail. The oblique position with respect to the counter blade given therein to the rail makes it possible to direct the rebound of the granulate on the rail such that the granulate lands in the discharge channel on a short path and cannot impinge on further areas of the device and, thereby, causes a further wear there.

Conveniently, the rail is divided up into several strips engaging each other longitudinally. This facilitates the production of the rail and furthermore allows to exchange rail parts which are exposed to wear, earlier than other rail parts.

In the Figures, an embodiment of the invention is shown.

FIG. 1 shows the blade carrier with counter blade and rail with a dovetail like guide in perspective view;

FIG. 2 shows a side view of the arrangement according to FIG. 1 in an enlarged view;

FIG. 3 shows a principal view of the cutting wheel with the blade carrier and plastic strand fed there through;

FIG. 4 shows the blade carrier with counter blade and rail having a rounded holder.

The blade carrier 1 shown in FIG. 1, comprises a counter blade 2 screwed onto the blade carrier 1 at its upper side, which counter blade consists out of an especially hard material in order to thereby counteract to wear. Below the counter blade 2 at the blade carrier 1, the rail 3a and 3b divided up in two parts, is shown which are inserted into a dovetail like groove 4 in the blade carrier 1. The arrangement of the support of the rail 3a and 3b in the dovetail shaped support can clearly be taken from FIG. 2 to which it is considered in more detail below.

The rail 3a and 3b extends alongside the blade carrier 1 across the total length of the counter blade 2. The rail is divided up, out of manufacturing technology reasons, into separate parts which are shown as parts 3a and 3b, in order to exchange, if necessary, individual parts because of a possible wear earlier than other parts. The blade carrier 1 has downward extending bolts 5, 6 and 7 (further bolts with a corresponding length of the blade carrier 1) which are fitted into a machine frame of the referenced device for granulating plastic strands and which serve for supporting the blade carrier 1 in the machine frame.

The side view of the blade carrier 1 with the counter blade 2 and the rail 3a/3b shown in FIG. 2 shows the dovetail guide for the rail 3a/3b. The guide for the rail 3a/3b comprises, at the downward facing side thereof, the undercut 8 and on its side facing the counter blade 2, the undercut 9, whereby both undercuts form a dovetail guide by which the rail 3a/3b is firmly supported in the counter blade 1. Therein, the undercut 9 is designed and arranged such that the separating strip 10 formed between the side of the rail 3a/3b and the lower end of the counter blade 2, reduces outwards in a blade-like fashion such that, at the one hand, the respective outer edge 11 of the counter blade and the separating strip 9 are approaching each other in a blade-like manner outwards in the direction to the cutting wheel (see FIG. 3) such that only a narrow strip of the material of the blade carrier 1 appears practically in the direction to the cutting wheel such that, at this location, practically a wear caused by collision of the granulate cannot be produced since it is collected either by the lower part of the counter blade 2 or the rail 3a/3b. As can be seen, the lower front edge 12 of the rail 3a/3b protrudes in the direction of the cutting wheel whereby, on the one hand, the above-mentioned effect of the separating strip is caused which reduces in its thickness in a blade-like manner, and, on the other hand, the rail 3a/3b protrudes in such a way that granulate which impinges thereon (see FIG. 3), is directed away from the blade carrier 1 directly into a discharge channel.

In FIG. 3, the structural elements which are relevant in this connection, of a device for granulating plastic strands is shown wherein the cutting wheel, the counter blade and the blade carrier are known elements which are also embodied in the mentioned structure in the state of the art. As shown in FIG. 3, granulate cut of from the strand 13 by the cutting wheel, is directed to the rail 3a/3b, impinges on the rail 3a/3b in a flat curve and, therefore, does not cause a particularly large wear. The material of the rail 3a/3b selected to be hard, ensures that continues bombardment of the rail 3a and 3b with cut-off granulate can erode the rail only slightly which may be compensated in case of a longer operation thereby that individual rail parts are exchanged by taking out the old once from the dovetail guide and by inserting new rail parts into the dovetail guide. In FIG. 3, the angle α which exists between the upper surface of the counter blade 2 and the rail 3a/3b, is shown in the circular section shown by a dashed-dotted line, which corresponds to the oblique position of the rail 3a/3b with respect to the counter blade 2.

In FIG. 4, a modification with respect to the arrangement of the rail is given. According to FIG. 4, the grove 20 is inserted into the blade carrier 2 for the rail 3, which grove corresponds in the cross section to a portion of a circle which ends to the opening side in an undercut each and which leads to the edges 18 and 19 tapering to the inside, whereby, also in this case, the effect of a dovetail guide is achieved. The grove 20 provided in this way by means of the drawn-in edges 18 and 19, holds the rail 3 comprising a correspondingly half circular cross section, securely within it selves such that it has only to be pushed out sideways only for replacement. With respect to the function of the rail 3 according to FIG. 4 shows the rail 3 is held within the guide only by contact between the guide and the rail. FIG. 4 also shows the rail 3 has a shape corresponding to the dovetail guide and is held within the dovetail guide by a dovetail connection only between the rail 3 and the guide such that the rail 3 only has to be pushed out sideways of the dovetail guide for replacement.

The invention claimed is:

1. A device for granulating plastic strands, comprising:
a cutting wheel having a plurality of blades and a counter blade disposed in a blade carrier, wherein
the plurality of blades of the cutting wheel are configured to graze pass the counter blade when the cutting wheel is rotated, thus configured to cut the plastic strands being guided over the counter blade into a granulate, wherein
an exchangeable rail running substantially parallel to the counter blade and disposed adjacent to and after the counter blade in a rotational direction of the cutting wheel, the rail being arranged at an angle α relative to a surface of the counter blade configured to divert the granulate into a discharge channel, wherein
the rail is held in a guide having a first undercut and a second undercut in the blade carrier on two sides of the guide in a longitudinal direction, wherein the rail is held within the guide only by contact between the guide and the rail, wherein
the first undercut of the guide facing the counter blade forms a separating strip having a thickness that reduces outwards such that, along with the second undercut of the guide, the rail assumes an oblique position relative to the counter blade in a transverse direction.

2. The device for granulating plastic strands according to claim 1, wherein the rail is divided up into several strips arranged longitudinally and engaging one another.

3. The device of claim 1, wherein the guide comprises a dovetail guide having the first undercut and the second undercut.

4. The device of claim 2, wherein the rail is located between the first undercut and the second undercut.

5. The device of claim 1, wherein an outer edge of the first undercut facing against the counter blade is next to an edge of the counter blade and a front edge of the rail protrudes in a direction towards the cutting wheel.

6. The device of claim 1, wherein the rail only has to be pushed out sideways of the guide for replacement.

7. The device of claim 1, wherein the rail has a shape corresponding to the guide.

8. The device of claim 3, wherein the rail has a shape corresponding to the guide.

9. A device for granulating plastic strands, comprising:
a cutting wheel having a plurality of blades and a counter blade disposed in a blade carrier, wherein
the plurality of blades of the cutting wheel are configured to graze pass the counter blade when the cutting wheel is rotated, thus configured to cut the plastic strands being guided over the counter blade into a granulate, wherein
an exchangeable rail running substantially parallel to the counter blade and disposed adjacent to and after the counter blade in a rotational direction of the cutting wheel, the rail being arranged at an angle α relative to a surface of the counter blade configured to divert the granulate into a discharge channel, wherein
the rail is held in a guide having a first undercut and a second undercut in the blade carrier on two sides of the guide in a longitudinal direction, wherein the rail is held within the guide by contact between the guide and the rail, wherein the first undercut of the guide facing the counter blade forms a separating strip having a thickness that reduces outwards such that, along with the second undercut of the guide, the rail assumes an oblique position relative to the counter blade in a transverse direction.

10. A device for granulating plastic strands, comprising:
a cutting wheel having a plurality of blades and a counter blade disposed in a blade carrier, wherein
the plurality of blades of the cutting wheel are configured to graze pass the counter blade when the cutting wheel is rotated, thus configured to cut the plastic strands being guided over the counter blade into a granulate, wherein
an exchangeable rail composed of a wear-resistant material running substantially parallel to the counter blade is disposed adjacent to the counter blade and after the counter blade in a rotational direction of the cutting wheel, the rail being arranged at an angle α relative to a surface of the counter blade configured to divert the granulate and conduct the granulate into a discharge channel, wherein
the rail is held in a dovetail guide having a first undercut and a second undercut in the blade carrier on two sides of the guide in a longitudinal direction, whereby the rail has a shape corresponding to the dovetail guide and is held within the dovetail guide by a dovetail connection only between the rail and the guide such that the rail only has to be pushed out sideways of the dovetail guide for replacement, wherein
the first undercut of the dovetail facing the counter blade forms a separating strip having a thickness that reduces outwards such that, along with the second undercut dovetail, the rail assumes an oblique position relative to the counter blade in a transverse direction, and wherein
an outer edge of the first undercut facing against the counter blade is next to an edge of the counter blade, and a front edge of the rail protrudes in a direction towards the cutting wheel.

* * * * *